United States Patent
Vogel

(10) Patent No.: US 8,295,704 B2
(45) Date of Patent: Oct. 23, 2012

(54) LASER TRANSMITTING AT AUTOMATICALLY VARYING WAVELENGTHS, NETWORK INTERFACE UNIT AND SYSTEM INCLUDING THE LASER, AND METHOD OF AUTOMATICALLY VARYING THE WAVELENGTH OF A LASER

(75) Inventor: Mark Vogel, Statesville, NC (US)

(73) Assignee: CommScope, Inc. of North Carolina, Hickory, NC (US)

( * ) Notice: Subject to any disclaimer, the term of this patent is extended or adjusted under 35 U.S.C. 154(b) by 622 days.

(21) Appl. No.: 12/489,559

(22) Filed: Jun. 23, 2009

(65) Prior Publication Data

US 2009/0317091 A1    Dec. 24, 2009

Related U.S. Application Data

(60) Provisional application No. 61/075,178, filed on Jun. 24, 2008.

(51) Int. Cl.
*H04J 14/02* (2006.01)
(52) U.S. Cl. .......... 398/95; 398/196; 398/200; 398/201; 372/32; 372/34
(58) Field of Classification Search .................. 398/34, 398/58–79, 91, 95, 182, 196; 385/14; 372/28–33
See application file for complete search history.

(56) References Cited

U.S. PATENT DOCUMENTS

| | | | |
|---|---|---|---|
| 5,850,303 A * | 12/1998 | Yamamoto et al. | 398/91 |
| 6,185,232 B1 * | 2/2001 | Hess et al. | 372/28 |
| 2003/0174746 A1 * | 9/2003 | Lano et al. | 372/33 |
| 2004/0008995 A1 * | 1/2004 | Ono et al. | 398/182 |
| 2006/0088319 A1 * | 4/2006 | Morton | 398/79 |
| 2006/0098697 A1 | 5/2006 | Kim | |
| 2006/0177225 A1 * | 8/2006 | Paraschis et al. | 398/87 |
| 2007/0172169 A1 * | 7/2007 | Kish et al. | 385/14 |
| 2008/0101801 A1 * | 5/2008 | Khalouf et al. | 398/193 |

OTHER PUBLICATIONS

Eskildsen, L. et al., "Stimulated Brillouin Scattering Suppression with Low Residual AM Using a Novel Temperature Wavelength-Dithered DFB Laser Diode," Electronics Letters, IEE Stevenage, GB, vol. 32, No. 15 Jul. 18, 1996, 1387-1389 (XP006005424) ISSN: 0013-5194 (abstract).

* cited by examiner

*Primary Examiner* — Li Liu
(74) *Attorney, Agent, or Firm* — Muncy, Geissler, Olds & Lowe PLLC

(57) ABSTRACT

A laser unit, usable in a network interface unit (NIU), that includes a laser adapted to generate an optical signal having a wavelength, a temperature control system for establishing a temperature of the laser and a controller functionally connected to the temperature control system for setting the temperature, the controller configured to automatically vary the temperature between a high temperature and a low temperature different than the high temperature. Also an NIU and a system of NIU's including the laser and an associated method of controlling the laser.

17 Claims, 4 Drawing Sheets

LASER TRANSMITTING AT AUTOMATICALLY VARYING WAVELENGTHS, NETWORK INTERFACE UNIT AND SYSTEM INCLUDING THE LASER, AND METHOD OF AUTOMATICALLY VARYING THE WAVELENGTH OF A LASER

CROSS-REFERENCE TO RELATED APPLICATIONS

The present application claims the benefit of U.S. Provisional Patent Application No. 61/075,178 filed Jun. 24, 2008, the entire contents of which are hereby incorporated by reference.

FIELD OF THE INVENTION

The present invention is directed toward a laser transmitting at automatically varying wavelengths and toward a method of automatically varying the wavelength of the laser which method and laser are suitable for use in a network interface unit, and, more specifically, toward a laser having a temperature controller adapted to automatically vary the temperature of the laser to reduce the likelihood of multiple lasers in a system transmitting at the same wavelength, and toward a method of automatically varying the temperature of a laser suitable for use in a network interface unit.

BACKGROUND OF THE INVENTION

RF-based fiber-to-the-home (FTTH) systems have been developed for cable television operators who want an alternative to the standards-based passive optical networks (PON). One benefit of such systems is that they are transparent to the RF signals they carry, and this allows an operator to continue to use the same customer premise equipment (CPE) that is used on their hybrid fiber/coax (HFC) networks. This equipment includes set-top boxes, DOCSIS cable modems, and DOCSIS VoIP modems.

In RF-based systems, the network interface unit (NIU) placed at the customer location contains a laser for upstream optical transmission. The laser utilizes burst mode transmission in the upstream direction and is inactive until an RF signal is generated by one of the CPE devices in the home. When that signal (which may be modified before reaching the laser) reaches the upstream laser it activates the laser by directly modulating its optical output. When the RF burst ends, the laser returns to its inactive state. Because of the protocol used by the cable modems, only one modem is active at a given time on a given RF upstream channel.

With only one modem active at a time, only one NIU on the relevant portion of the fiber network will be transmitting at a given time. However, when there is more than one upstream channel for a modem to use it is possible to have more than one NIU transmitting at a given time. For example, one NIU may be transmitting a signal from a cable modem operating on a first channel, while another NIU is transmitting a signal from a cable modem operating on a second channel. In this case there will be an optical collision at the upstream receiver. A similar problem may occur when a cable modem from one location is transmitting, and a set-top box (STB) from another location is also transmitting. Since the STB and cable modems operate independently, there is no synchronization and therefore the transmission timings of the two systems may overlap.

The systems (whether set-top boxes or cable modems on one or more upstream channels) operate on different RF frequencies; therefore, if the operating wavelengths of the two lasers do not significantly overlap, the result of the optical collision will simply be a degradation in link performance. When the laser wavelengths do significantly overlap a mixing occurs in the optical receiver which results in the generation of an RF signal who frequency is at the difference between the operating wavelengths of the two lasers. This signal can be sufficiently large that it overdrives the input of all the upstream systems attached to that receiver and makes a channel non-functional for the duration of that burst. Similar problems will occur in any future burst if two or more NIUs are simultaneously active and their wavelengths significantly overlap. Because of the protocols associated with the CPE devices, this could knock the devices off of the network and cause them to re-initialize on the network.

One of the difficulties in resolving this problem is that the operating wavelength of a laser is dependent on its temperature, and NIUs are often used in an outside plant environment where temperatures can range from −40 to +65° C. In addition, one NIU may be in the sun while another is in the shade, and this causes a temperature differential between the two units. The operating wavelength of a laser changes by about 0.1 to 0.5 nm/° C. depending on laser design. Therefore, while a system may nominally include lasers transmitting at different wavelengths, these wavelengths may change with changing temperature over the course of a day. The wavelength of one NIU may thus walk through the wavelengths of other NIUs on the network or may reach a temperature that parks it on the same wavelength as that of another NIU.

One way of addressing this problem is to use lasers in NIU's connected to a given receiver that have sufficiently spaced wavelengths so that, over the expected temperature range, they will never overlap. In other words, each NIU in a group served by a particular receiver would require a different wavelength. However, this approach is not entirely satisfactory because it increases the system cost and complexity. Under this approach, lasers must be sorted into groups that meet the requirements of a particular operating window in a system, much like coarse wavelength division multiplexing (CWDM). In addition, the solution requires an operator to stock complete sets of NIUs (each having a unique wavelength) which could be as many as 32 per set. This may become difficult to manage when deploying and subsequently maintaining a system. It also takes up spectrum on the fiber that could be used to support other services such as business overlays.

It would therefore be desirable to provide a system that reduces the problem of interference between lasers transmitting upstream to a receiver which system does not require the use of lasers operating at widely spaced wavelengths.

SUMMARY OF THE INVENTION

These problems and others are addressed by embodiments of the present invention, a first aspect of which comprises a laser unit usable in a network interface unit (NIU). The laser unit includes a laser adapted to generate an optical signal having a wavelength, a temperature control system for establishing a temperature of the laser, and a controller functionally connected to the temperature control system for setting the temperature. The controller is configured to automatically vary the temperature between a high temperature and a low temperature different than the high temperature.

Another aspect of the invention comprises an NIU that includes a laser adapted to generate an optical signal having a wavelength, a first connector connectable to an optical fiber, an optical pathway from the laser to the first connector, a second connector connectable to an electrical conductor, and an electrical pathway from the laser to the second connector. The NIU also includes a temperature control system for establishing a temperature of the laser and a controller functionally connected to the temperature control system for setting the temperature, the controller configured to automatically vary the temperature between a high temperature and a low temperature different than the high temperature.

An additional aspect of the invention comprises a method that involves providing at least one laser adapted to generate an optical signal having a wavelength, providing a temperature control system for establishing a temperature of the at least one laser, and automatically varying the temperature between a high temperature and a low temperature different than the high temperature.

Yet another aspect of the invention comprises a system that includes a plurality of NIU's adapted to communicate with a receiver via an optical fiber and a plurality of first terminal units connected to each of the NIU's, the first terminal units configured to transmit signals to the NIU's for transmission by the NIU's onto the optical fiber. Each of the NIU's includes a laser adapted to generate an optical signal having a wavelength, a temperature control system for establishing a temperature of the laser and a controller functionally connected to the temperature control system for setting the temperature, where the controller is configured to automatically vary the temperature between a high temperature and a low temperature different than the high temperature.

BRIEF DESCRIPTION OF THE DRAWINGS

These benefits and others will be better understood after a reading of the following detailed description together with the attached drawings, wherein.

DETAILED DESCRIPTION

Figure 1:
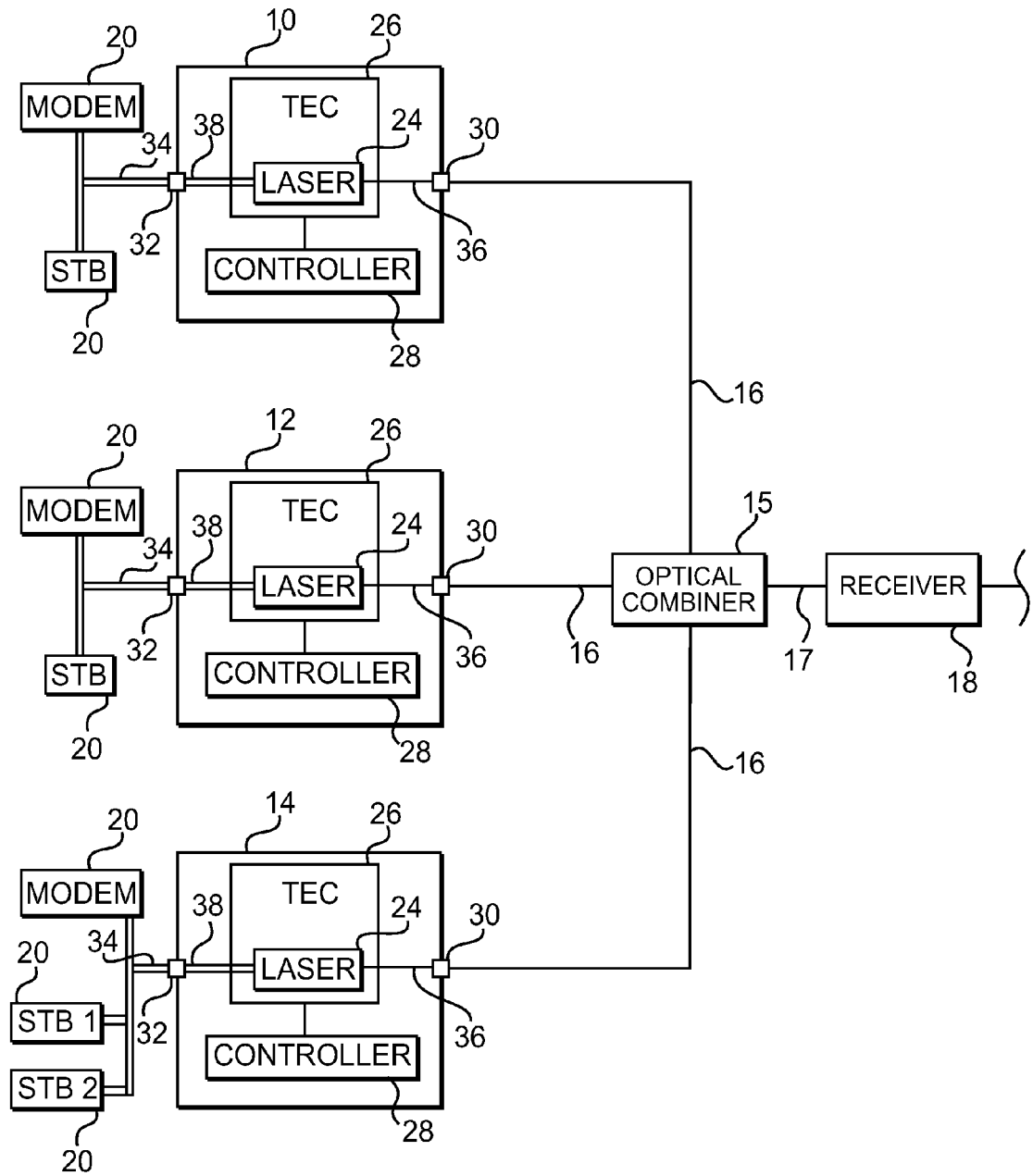
FIG. 1 is a schematic illustration of a system of network interface units (NIU's) according to an embodiment of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

FIG. 1 illustrates a system comprising a plurality of network interface units (NIU's) 10, 12, 14 connected by optical fibers 16 to an optical combiner 15 and by an additional optical fiber 17 to receiver 18. NIU's 10, 12 and 14 are optical NIU's which may sometimes be referred to as optical network units (ONU's) or optical network terminals (ONT's). As used herein, "NIU" is intended to include ONU's and ONT's. The NIU's 10, 12, 14 may be located, for example, at subscriber locations such as homes or businesses, and provide an interface between terminal units 20, such as modems and set top boxes (STB's), at a subscriber's location and a receiver 18. The NIU's 10, 12 and 14 are substantially identical, and therefore the following discussion will be directed primarily to NIU 10. NIU 10 includes a laser 24 for sending signals from the terminal units 20 upstream to receiver 18, a thermoelectric cooler (TEC) 26 thermally connected to laser 24 and a controller 28, discussed in greater detail below, for establishing the temperature of TEC 26 and thus the operating temperature of laser 24. NIU's 10 also includes a first connector 30 that connects to one of the optical fibers 16, a second connector 32 that connects to a coaxial cable 34 or other electrical conductor at a customer location, an optical pathway 36 in the NIU 10 that carries light from laser 24 to the optical fiber 16 and an electrical pathway 38 that carries electrical signals from the coaxial cable 34 to the laser 24.

The lasers in each of the NIU's 10, 12 and 14 nominally operate at the same wavelength—1310 nanometers, for example. However, such lasers often have a variance in transmission wavelength, even when operating at the same temperature. To increase this variance and reduce the likelihood of two lasers transmitting at the same wavelength embodiments of the present invention establish different offset temperatures for each of the lasers 24 in a group of NIU's connected to a given receiver 18. The increase in variance may be achieved by selecting a base temperature, 25° C. for example, and a temperature offset range, ±10° C. for example. Each laser within the group randomly establishes a temperature offset value that is less than or equal to the temperature offset range. For each laser 24 in NIU 10, might select a temperature offset value of +3° C., the laser in NIU 12, might select an offset of −10° C., and the laser 24 in NIU 14 might select an offset of +8° C., etc. This random selection allows for an increased variance without requiring controllers in different NIU's to communicate with one another. If communication between NIU's were provided for other reasons, offset temperatures could be assigned to be mutually different. Alternately, offset temperatures could be preset at each NIU on installation.

Figure 2:
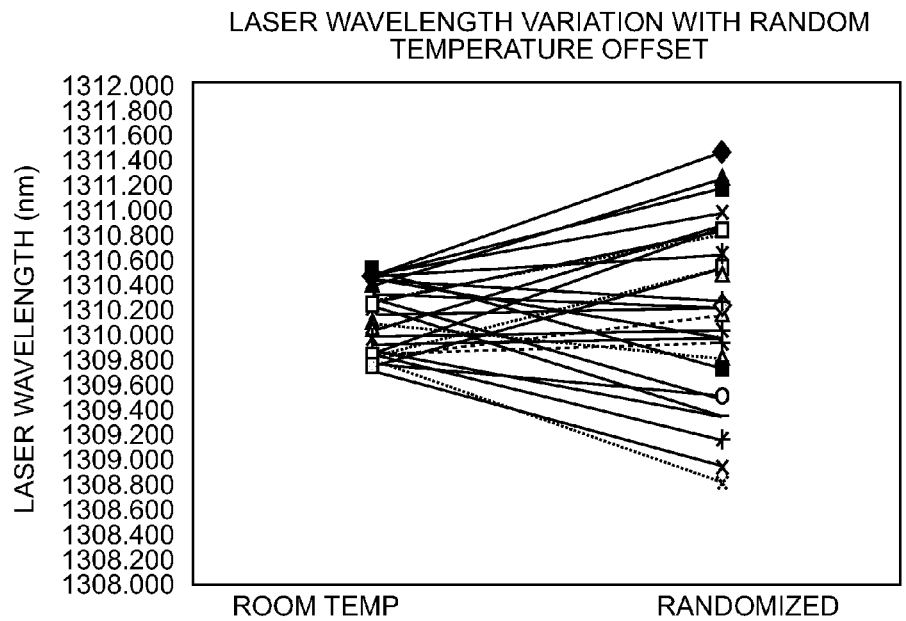
FIG. 2 is a graph illustrating a variance in temperature offset of initial laser temperatures in the system of FIG. 1.

After selection of an offset temperature, the controller 28 in each NIU 10, 12, 14 sets the temperature of the associated TEC 26 to the base temperature plus the selected offset temperature. In the example, the implemented temperature for the laser 24 in NIU 10 would be 25° C.+3° C. or 28° C. As illustrated in FIG. 2, the effect of this process is that a group of lasers, which may have had a variance of 1 nm at room temperature, would have a spread of 1 nm plus 20 times the change in wavelength per unit temperature for the laser. If laser 24 comprises a distributed feedback laser (DFB), which has a wavelength variance of about 0.1 nm/° C., the 1 nm variance would increase to 1+20° C. times 0.1 nm/° C. or 3 nm. The degree of increase in variance will increase with the temperature offset range. The disclosed embodiment uses TEC's 26 to accomplish this temperature control. Other methods of temperature control could also be used depending on the location of the lasers.

Even with this initial randomization of operating wavelength, there is a probability that two lasers 24 will still have the same wavelength. The method of the disclosed embodiment adds temperature dithering, which slightly varies the temperature of each laser around its starting, offset, temperature. Dithering each laser will move each laser's wavelength so that if there is an overlap between two lasers, it will only occur for a limited period of time. To dither the laser temperature, a total dithering range, ±1.5° C. for example, is set in controller 28. In addition, a minimum dithering increment, 0.25° C. for example, is also set in controller 28.

To increase the probability of two wavelengths moving away from each other, each controller 28 randomly establishes a dithering increment for its associated laser 24 that is greater than the minimum increment but less than the dithering range. When a dithering temperature increment is applied, each controller 28 randomly establishes a direction for incrementing the temperature (either an increase or a decrease). The dithering direction is continued with each application of a dithering increment until the total dithering limit is reached. At that time, the controller 28 changes the dithering direction until the other limit is reached, and the dithering direction is changed again. By having each controller 28 establish a random dithering temperature increment and a random dithering direction, the system has a decreased probability of two laser wavelengths tracking as the controllers 28 dither the wavelengths. Also by having a controller 28 continue to dither in the same direction until a limit is reached instead of randomly dithering up or down, the lasers 24 are more likely to move away from an overlapping condition instead of moving repeatedly into and out of an overlapping condition.

The potential for wavelength overlap is further reduced by randomizing the dithering interval. This may be done by establishing a number of time increments during which a dithering decision is made. Before each time increment, each controller 28 uses a selection process to decide whether to dither. For example, the controller 28 may randomly select a value from 0 to 1 and if that values falls within an established dithering activation range of 0 to 0.2, then the controller 28 implements a dithering temperature increment in the determined direction (increase or decrease). If the value does not fall within the given range, no change is made to the laser temperature for that time increment. Other randomization procedures and/or different values for the activation range could also be used. In this manner, the controllers 28 dither the laser temperatures independently, and at random intervals.

Figure 3:
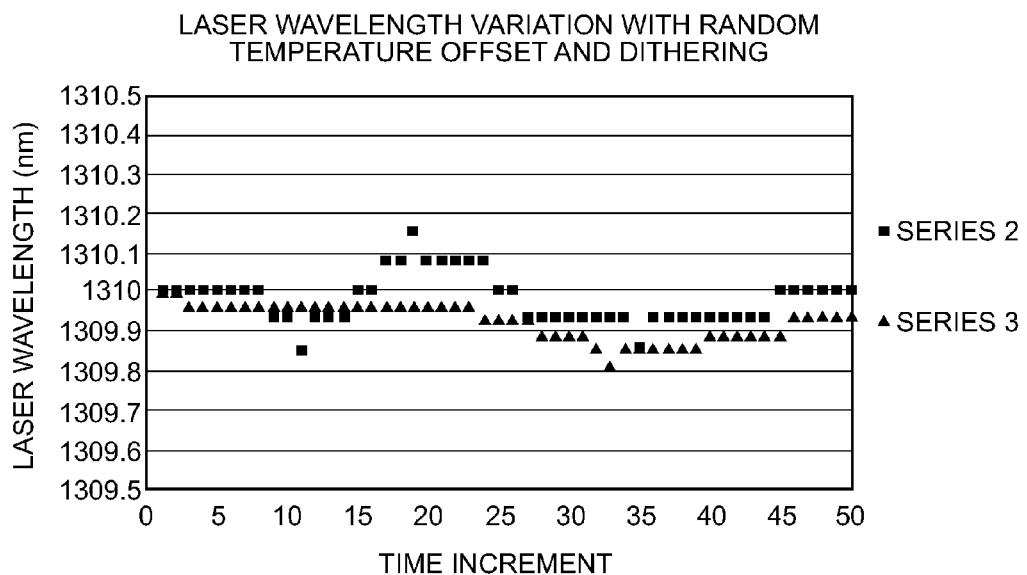
FIG. 3 is a graph of laser temperature over time when a method of laser temperature control according to an embodiment of the present invention is practiced.

A graph showing the expected operating temperature of two lasers after 50 time increments is shown in FIG. 3. The magnitude of the dithering time interval may vary from continuously or substantially continuously to longer intervals of a second or more. A typical interval from the time a modem sends a packet to the time it is allowed to send a second packet may be on the order of microseconds. Such a time interval thus might be selected as the dithering interval. By using that time scale, a modem may lose one packet due to a wavelength overlap, but then in the next interval the overlap would be gone. However, the probability that the wavelengths of two NIUs whose modems are on different DOCSIS channels and are bursting at the same time is already relatively low given the nature of a TDMA communication, and the initial wavelength randomization process. Thus dithering steps that occur every 100 ms or even once per second may significantly reduce the problem of transmissions at overlapping wavelengths.

Control circuitry for accurately controlling the temperatures of lasers to tenths of a degree C. are known from dense wavelength divisional multiplexing (DWDM) systems. Suitable controllers for maintaining the temperature of a TEC and associated laser are available, for example, from Maxim Integrated Products of Sunnyvale, Calif., which are adapted to rapidly respond to temperature changes to maintain a TEC at a required temperature. Other suitable controllers for maintaining TEC temperature could alternately be used.

Figure 4:
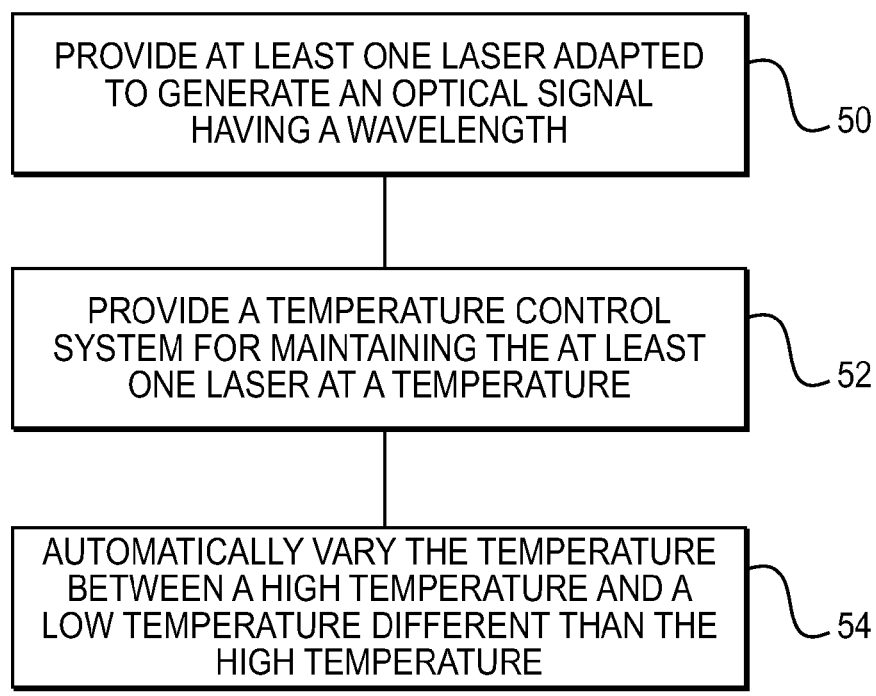
FIG. 4 is a flowchart illustrating a method according to an embodiment of the present invention.

A method according to an embodiment of the invention is illustrated in FIG. 4 and includes a block 50 of providing at least one laser adapted to generate an optical signal having a wavelength, a block 52 of providing a temperature control system for maintaining the at least one laser at a temperature, and a block 54 of automatically varying the temperature between a high temperature and a low temperature different than the high temperature.

Figure 5:
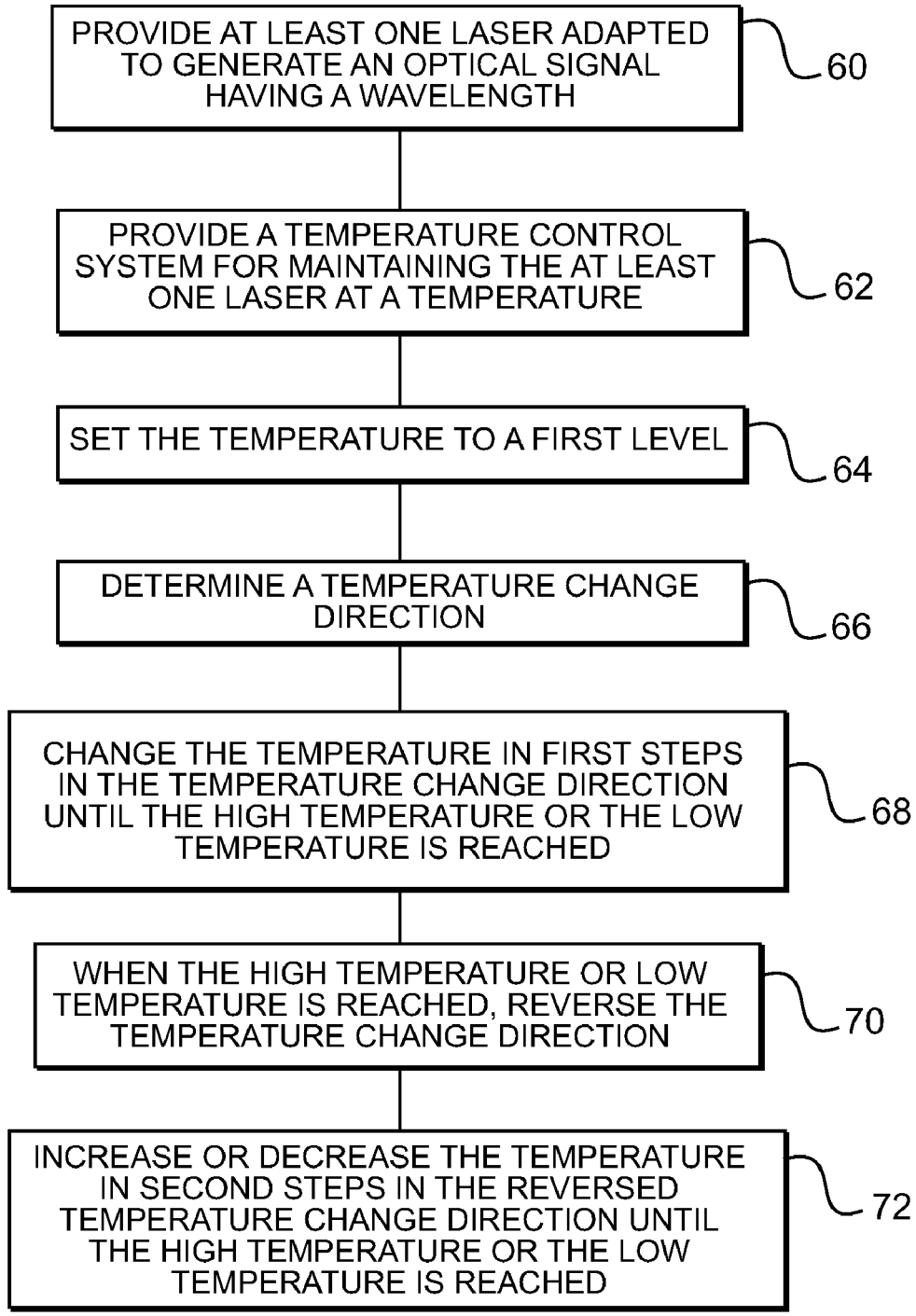
FIG. 5 is a flowchart illustrating another method according to an embodiment of the present invention.

Another method according to an embodiment of the invention is illustrated in FIG. 5 and includes a block 60 of providing at least one laser adapted to generate an optical signal having a wavelength, a block 62 of providing a temperature control system for maintaining the at least one laser at a temperature and a block 64 of setting the temperature to a first level. The method further includes a block 66 of determining a temperature change direction and a block 68 of changing the temperature in first steps in the temperature change direction until the high temperature or the low temperature is reached. The method also includes, when the high temperature or low temperature is reached, a block 70 of reversing the temperature change direction and a block 72 of increasing or decreasing the temperature in second steps in the reversed temperature change direction until the high temperature or the low temperature is reached.

The present invention has been described in terms of presently preferred embodiments. Modifications and additions to these embodiments will become apparent to those of ordinary skill in the relevant arts upon a reading of the foregoing description. It is intended that all such modifications and additions comprise a part of the present invention to the extent they fall within the scope of the several claims appended hereto.

What is claimed is:

1. A laser unit usable in a network interface unit (NIU), the laser unit comprising:
    a laser adapted to generate an optical signal having a given wavelength at a given temperature;
    a temperature control system for establishing an operating temperature of the laser; and
    a controller functionally connected to the temperature control system, the controller configured to automatically vary the operating temperature between a high temperature and a low temperature different than said high temperature,
    wherein the controller is configured to determine a step size, to increase the operating temperature in steps until the high temperature is reached and to thereafter decrease the operating temperature in steps until the low temperature is reached, and
    wherein the controller is configured to determine a temperature change direction, to determine a time interval, and to determine whether to change the operating temperature in a given time interval.

2. The laser unit of claim 1 wherein the temperature control system comprises a thermoelectric cooler.

3. The laser unit of claim 1 wherein the offset amount is randomly determined.

4. The laser unit of claim 1 wherein the controller is configured to change the operating temperature in steps of a given size.

5. The laser unit of claim 1 wherein the controller is configured to determine randomly for each time interval whether to change the operating temperature.

6. The laser unit of claim 1 wherein the first steps are equal in size to the second steps.

7. The laser unit of claim 1 wherein the time interval is one second or less.

8. The laser unit of claim 1 wherein the time interval is 100 microseconds or less.

9. An NIU including a laser unit according to claim 1.

10. An NIU including a laser unit according to claim 1.

11. A network interface unit (NIU) comprising:
    a laser unit according to claim 1;
    a first connector connectable to an optical fiber;
    an optical pathway from the laser to the first connector;
    a second connector connectable to an electrical conductor; and
    an electrical pathway from the laser to the second connector.

12. The system of claim 1, wherein the controller is configured to determine an offset amount and set the operating temperature of the laser to a starting temperature offset from the given temperature by the offset amount.

13. A method comprising:
    providing at least one laser adapted to generate an optical signal having a given wavelength at a given temperature;
    providing a temperature control system for establishing an operating temperature of the at least one laser and for determining an offset amount;
    setting the operating temperature to a starting temperature offset from the given temperature by the offset amount; and
    automatically varying the operating temperature between a high temperature and a low temperature different than the high temperature,
    wherein automatically varying the temperature comprises:
    determining a temperature change direction;
    changing the temperature in first steps in the temperature change direction until the high temperature or the low temperature is reached; and
    when the high temperature or low temperature is reached, reversing the temperature change direction;
    increasing or decreasing the temperature in second steps in the reversed temperature change direction until the high temperature or the low temperature is reached, and further including determining a series of time periods and, for each time period, randomly determining whether to change the temperature during the each time period.

14. A system comprising:
    a plurality of network interface units (NIU) adapted to communicate with a receiver via an optical fiber and each including a laser unit each laser unit comprising;
    a laser adapted to generate an optical signal having a given wavelength at a given temperature;
    a temperature control system for establishing an operating temperature of the laser; and
    a controller functionally connected to the temperature control system, the controller configured to automatically vary the operating temperature between a high temperature and a low temperature different than said high temperature,
    the system further comprising:
    a plurality of first terminal units connected to each of the NIU's, the first terminal units configured to transmit signals to the NIU's for transmission by the NIU's onto the optical fiber,
    wherein the controllers in the plurality of NIU's set the operating temperatures of the lasers in the plurality of NIU's to at least two different first levels and vary the operating temperatures away from the first levels in a first direction or a second direction and in steps of different sizes from the steps used by other NIU's of the plurality of NIU's at different time intervals.

15. The system of claim 14 including a plurality of second terminal units connected to each of the NIU's, the second terminal units configured to transmit signals to the NIU's for transmission by the NIU's onto the optical fiber, wherein the plurality of first terminal units transmit on a first channel and the plurality of second terminal units transmit on a second channel.

16. The system of claim 14 wherein the controllers in the plurality of NIU's select a size of the steps and wherein in a first set of the plurality of NIU's the size of the steps is mutually different.

17. The system of claim 14 wherein the controller is configured to determine an offset amount and set the operating temperature of the laser to a starting temperature offset from the given temperature by the offset amount.

* * * * *